(12) United States Patent
Maoz et al.

(10) Patent No.: US 7,281,185 B2
(45) Date of Patent: Oct. 9, 2007

(54) METHOD AND APPARATUS FOR MAXIMIZING AND MANAGING TEST COVERAGE

(75) Inventors: Uri Maoz, Rehovot (IL); Amos Noy, Jerusalem (IL)

(73) Assignee: Cadence Design (Israel) II Ltd., Rosh Ha'ayin (IL)

( * ) Notice: Subject to any disclaimer, the term of this patent is extended or adjusted under 35 U.S.C. 154(b) by 0 days.

(21) Appl. No.: 10/851,134

(22) Filed: May 24, 2004

(65) Prior Publication Data

US 2004/0216023 A1  Oct. 28, 2004

Related U.S. Application Data

(63) Continuation-in-part of application No. 09/799,065, filed on Mar. 6, 2001, now Pat. No. 7,114,111, which is a continuation-in-part of application No. 09/327,966, filed on Jun. 8, 1999, now Pat. No. 6,675,138.

(60) Provisional application No. 60/208,822, filed on Jun. 2, 2000.

(51) Int. Cl.
*G01R 31/28* (2006.01)
(52) U.S. Cl. ..................... 714/738; 714/742
(58) Field of Classification Search ............... 714/724, 714/741, 742, 738
See application file for complete search history.

(56) References Cited

U.S. PATENT DOCUMENTS

| | | | |
|---|---|---|---|
| 4,937,765 A | 6/1990 | Shupe et al. | |
| 5,202,889 A | 4/1993 | Aharon et al. | |
| 5,450,414 A | 9/1995 | Lin | |
| 5,633,812 A | 5/1997 | Allen et al. | |
| 5,680,332 A | 10/1997 | Raimi et al. | |
| 5,844,909 A | 12/1998 | Wakui | |
| 5,862,149 A * | 1/1999 | Carpenter et al. | 714/726 |
| 6,044,214 A | 3/2000 | Kimura et al. | |
| 6,052,809 A | 4/2000 | Bowden | |
| 6,059,451 A | 5/2000 | Scott et al. | |
| 6,845,479 B2 * | 1/2005 | Illman | 714/739 |

OTHER PUBLICATIONS

Sneed "State Coverage of Embedded Realtime Programs", Proc. 2nd Workshop on Software Testing, Verification & Analysis, p. 145, 1998.
Greggain et al. "Fault Grading, a Measure of Logic Simulation Integrity", Proc. 2nd Annual IEEE ASIC Seminar and Exhibit, p. 9-2.1-9-2.4, Sep. 1989.
Piwowarski et al. "Coverage Measurement Experience During Function Test", IEEE Proc. 15th Int. Conf. Software Engineering, p. 287-301, 1993.
Moundanos et al. "Abstraction Techniques for Validation Coverage Analysis and Test Generation", IEEE Transaction on Computers, 47(1): 2-14, 1998.
Debany et al. "Design Verification Using Logic Test", IEEE, p. 17-24, 1992.
Benjamin et al. "A Study in Coverage-Driven Test Generation", DAC, p. 970-975, 1999.

* cited by examiner

*Primary Examiner*—James C. Kerveros
(74) *Attorney, Agent, or Firm*—Rosenberg, Klein & Lee (57) ABSTRACT

A method and system for managing test generation and examination of test coverage so as to most efficiently obtain maximum coverage during test generation. Therefore, in addition to achieving coverage maximization, the present invention also preferably manages test generation in order to increase the efficiency of testing to obtain such coverage maximization. The present invention also preferably provides tactics and/or strategies for generation as part of such management. Thus, coverage providing by test generation and execution is not only measured, but is also preferably obtained in a more efficient manner by enabling the coverage maximization functions to provide feedback and management to the test generation process.

23 Claims, 5 Drawing Sheets

METHOD AND APPARATUS FOR MAXIMIZING AND MANAGING TEST COVERAGE

CROSS REFERENCE TO RELATED APPLICATIONS

This application is a continuation in part of commonly assigned U.S. patent application Ser. No. 09/799,065, filed Mar. 6, 2001, now U.S. Pat. No. 7,114,111 entitled "Method and Apparatus for Maximizing Test Coverage", which is a continuation in part of copending, commonly assigned U.S. patent application Ser. No. 09/327,966, filed Jun. 8, 1999, entitled "System and Method for Measuring Temporal Coverage Detection", now U.S. Pat. No. 6,675,138, and also which is a continuation in part of U.S. Provisional Patent Application No. 60/208,822, filed Jun. 2, 2000 entitled "Method and Apparatus for Maximizing Test Coverage"; all of which are hereby incorporated herein in full by reference.

FIELD OF THE INVENTION

This invention relates to computer software, more particularly to computer software for analyzing the functionality of a circuit design and for analyzing the functional correctness of the circuit design.

BACKGROUND OF THE INVENTION

The field of electronic design automation (EDA) is well established. A number of software tools are used to describe a circuit at various levels of granularity or specificity. Such tools include gate level descriptions, which specify the circuit in very great detail, to high level descriptions written in hardware description languages such as Verilog or VHDL. The process of verifying a design through a simulation model of the device is aided by the availability of Verilog and VHDL. These languages are designed to describe hardware both at higher levels of abstraction and as gates or transistors, thus enabling designers to describe the elements and connections between elements of a circuit. Modern circuits have many millions of transistors, so it is essential to use some sort of design tools just to manage the complexity of the design, particularly for design verification.

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

As previously described, the process of verifying a design through a simulation model of the device is aided by the availability of hardware description languages such as Verilog and VHDL. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment, particularly for functional verification in order for the various elements be defined and connected together correctly in order to have the circuit perform as specified. Specman Elite™, software developed by Verisity Ltd. in Israel and available through Verisity Design, Inc. in Mountain View, Calif., is the market leader in providing functional verification. Certain attributes of the software are described in copending, commonly assigned U.S. patent application Ser. No. 09/327,966, entitled "System and Method for Measuring Temporal Coverage Detection", filed Jun. 8, 1999, and incorporated herein in full by reference. Useful background information is presented in copending, commonly assigned U.S. patent application Ser. No. 09/020,792, filed Feb. 6, 1998, entitled "Method and Apparatus for Test Generation During Circuit Design."

The test generator disclosed in U.S. patent application Ser. No. 09/020,792 interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

However, the reliance on human intervention is still highly problematic, particularly for increasing the coverage of the tests. "Coverage" is a function of the ability to fully explore the reachable state space of the design, in order to examine all possible functions and outcomes of any particular input or set of inputs to the DUT. Although the coverage of these tests can be increased manually, this is clearly a disadvantage, as it requires extensive input by the engineer. Therefore, a number of methods for attempting to automatically increase coverage are known in the art.

There are generally two classes of "coverage boosters" known in the background art: structural analysis or "white box" systems and knowledge base systems. Structural analysis based coverage enhancement derives coverage from the structure of the DUT, most typically from a gate level implementation of the DUT. A goal such as "toggle each node" is picked as the coverage goal and the test generator is most often based on various search algorithms operating on a representation of the DUT structure. These techniques were first introduced to identify "stuck at" faults in manufactured circuits. An example would be a production test generator such as HITEC from the University of Chicago (Chicago, USA; as described in T. Niermann and J. H. Patel, "HITEC: A Test Generation Package for Sequential Circuits," European Design Automation Conf., Amsterdam, Netherlands, pp. 214-218, February 1991).

An example of a "white box" system is described with regard to U.S. Pat. No. 6,141,630, owned in common with the present application. This patent teaches a test bench for stimulating a simulated design with test vectors, after which the result is interpreted as though the design is a state diagram composed of blocks and transition arcs.

More recently there have been some such systems which operate on a higher level (for example Register Transfer Level). In essence such systems are based on the same techniques and most often synthesize the DUT into gates so that structural reasoning can be applied.

The shortcomings of all such methods are as follows. First, there is a lack of reference, since the coverage goals are taken from the DUT alone, without taking into account the specification requirements or the constraints imposed by the environment in which the DUT should function. This kind of testing fails to answer the most crucial question, which is whether the DUT actually functions as specified.

Second, with regard to capacity limitation, since the test generation algorithm requires an analysis of the DUT, the size of the DUT (or more accurately the state space projected by the state variables used to implement the DUT) must be limited. Current techniques are typically limited to small sub-sections of industrial designs.

Knowledge base systems are the second type of attempt to automatically increase coverage. In these cases the system has some knowledge of the specification of the DUT or the class of devices the DUT belongs to (CPUs for instance). Coverage goals are set according to the expected architectural and micro-architectural features. The knowledge base stores abstract tests aimed at various features. Such tests are applied to boost coverage where needed. The most prominent example of such system is Gensys from IBM (International Business Machines, USA), as disclosed in U.S. Pat. No. 5,202,889.

The major drawback of such a system is the need to construct such a knowledge base. The cost of constructing the knowledge base exceeds the manual work needed to test a specific DUT, so such an approach is viable only in cases where the knowledge base can be amortized over many generations of devices that are similar in function.

SUMMARY OF THE INVENTION

The background art does not teach or suggest a method for maximizing coverage of tests for the DUT through the management of test generation. The background art also does not teach or suggest such a method for examining coverage before, during and after test generation and execution.

The present invention overcomes these disadvantages of the background art by providing a method and system for managing test generation and examination of test coverage so as to most efficiently obtain maximum coverage during test generation. Therefore, in addition to achieving coverage maximization, the present invention also preferably manages test generation in order to increase the efficiency of testing to obtain such coverage maximization. The present invention also preferably provides tactics and/or strategies for generation as part of such management. Thus, coverage providing by test generation and execution is not only measured, but is also preferably obtained in a more efficient manner by enabling the coverage maximization functions to provide feedback and management to the test generation process.

As used herein, coverage optionally and preferably includes coverage from input generation and other types of coverage derived from generation, and also heuristically determined testing or test generation that also results in coverage. An example of the latter includes specific pattern(s) that may be suitable for testing cache memory for example.

One possible solution for improving test coverage, by identifying coverage holes, modifying the input process to test those areas, then repeating the process iteratively to continue to improve test coverage, forms part of the underlying structure of the present invention. The method and apparatus of the present invention extend this underlying structure by providing an engine for refined behavior during test generation. Furthermore, the present invention is capable of examining coverage before, during and after test generation and execution. Therefore, the present invention extends the previously described solution to maximization of test coverage with additional functionality. This additional functionality is preferably able to amplify random generation for test generation by causing tests to be generated which are more meaningful and which have a higher variability.

As taught by the previously described references of Verisity Ltd., coverage maximization may optionally start with a user-generated test, from which the coverage information is more preferably extracted, for example from the environment architectural files, and/or from other existing sources of coverage and testing information. Such information optionally and preferably includes coverage groups, items and buckets. Next, the test is run and the results are analyzed. Coverage holes are then automatically targeted by augmenting the test with additional constraints that, based on some heuristics, are expected to target these holes more effectively. The user's original test is optionally not altered; instead constraints may be added to a separate version of the test, such that the original constraints of the user are stored separately. Also, the previously described solution has the advantage of being able to determine that certain sets of constraints will prevent certain values or ranges of values from ever being reached by the test, and can act accordingly.

The coverage holes are preferably filled according to the grading scheme for the coverage which was described in the previous application. As the grade increases, the probability that the coverage is adequate increases, so the probability that additional coverage is required decreases. Therefore, these holes are preferably filled from lower to higher grades.

The present invention extends these concepts by interacting with the verification environment for the DUT (device under test), preferably to direct the test generation process in order to maximize coverage. Coverage maximization is now preferably an integral part of the test generation and execution process, rather than being mainly implemented as a metric for examining coverage after test execution. Furthermore, coverage maximization also preferably is used to analyze the testing strategy, in order to create more efficient and effective tests during the test generation process.

The present invention optionally and preferably operates within a verification environment, which provides permitted or legal input to the DUT (device under test) and which also provides at least some of the generation mechanisms for generating tests to be executed by the DUT, in order to be able to exercise the functions of the DUT and their boundaries to examine the behavior of the DUT. These boundaries are in turn examined by using constraints in the tests.

More preferably the test structure is determined as a generalized scenario rather than as a single test. As described with regard to U.S. patent application Ser. No. 10/661,772, "Method and System for Test Creation", filed on Sep. 15, 2003 and hereby incorporated by reference as if fully set forth herein, scenarios are a more general structure than a single test, and provide guidance for the optional generation of multiple tests. Preferably, one or more scenarios are defined for the operation of the present invention. These scenarios undergo a generation phase to create a "program instance" or a test program as described above. The program instance then undergoes generation to create a test instance (or test) as in the background art.

The process of using scenarios for test generation preferably starts by inputting one or more scenarios by the user and/or otherwise providing the scenario(s). These scenarios are provided with (optionally) one or more meta data elements and one or more constraints, indicating at least which scenarios may be combined together in a particular test program, and which are in conflict. Preferably, the constraint(s) are also provided for the test generation itself, as described in greater detail below. A selection is then made from these scenarios, including at least one such scenario but preferably including a plurality of (non-conflicting) scenarios. This selection is done by resolving the constraints associated. The selected scenario(s) are then combined in a combination phase, to form a combined scenario instance. This combination is then used to generate a test program at run time, in a generation phase, which is actually a continuation of the combination phase but is described separately for the purposes of illustration only and without any intention of being limiting.

Generalized scenarios have a number of advantages over single tests for operation with the present invention. For example, these scenarios may optionally be loaded together and mixed for a test run as described above, thereby providing richer stimuli to the DUT and potentially increasing test coverage. Generalized scenarios may optionally be selected according to a selection process, as described above, which is preferably parameterized such that selection is preferably at least partially driven or directed rather than being completely randomized. Such directed selection may optionally be performed according to the constraints. Also, generalized scenarios enable the tests themselves to be more easily analyzed, since they describe general guidance for test generation, such that the effect of the underlying structure may be more easily analyzed with scenarios than with actual tests.

The present invention may optionally be described as being implemented by a maximizer engine, which drives the process of maximizing coverage. Of course, the method of the present invention may optionally be implemented with any type of maximizer structure, so the description of an "engine" is for the purposes of clarity only and is not intended to be limiting in any way.

According to a preferred embodiment of the present invention, the maximizer engine operates during test generation in a maximization session, which preferably involves the generation and execution of a plurality of tests. More preferably, the maximizer engine directs the use of generalized scenarios to generate a plurality of tests as previously described. After some type of condition has been met, such as the execution of a particular number of tests (test runs) and/or overall iterations of the test run process, the maximizer engine then examines the coverage afforded by the test runs. The engine then preferably directs the next iteration of test runs, for example by optionally generating inputs to the test generation process.

Other examples of end-point conditions include, but are not limited to, the amount of time to be spent executing test runs, a minimum amount of coverage gained, a coverage grade target, and/or execution of the available set of generalized scenarios.

Preferably, the maximizer engine directs the performance of test runs (generation and execution of tests) according to one or more tactics. A tactic is a set of heuristics applied interchangeably according to a pre-programmed sequence of operations. Tactics are applied for a specific generation. Tactics are bound to (or associated with) a particular generatable entity, such as a field, preferably with regard to a certain context. The binding of tactics to the particular entity, such as the particular field, is preferably maintained throughout the run (e.g. throughout the specific test generation).

According to preferred embodiments of the present invention, binding is preferably performed as follows. Each field preferably has a seed domain (herein also referred to as a "seed"). The seed is the internal data structure from which generation starts and contains the generation state of the field in this context (mapping of its relationship to other fields). The seed also optionally provides random stability for the test generation, as the same generation behavior is expected if the same seed is used for a plurality of test generations. For the purpose of maximization, preferably each field is assigned a selector. Each selector has a list of tactics, which makes a more refined restriction (constraint) on values that can be generated. The end of generation results in a value being generated. Selection may optionally select more than one tactic to be imposed (layered) on a seed.

Some tactics require a context, or state information, to be associated with each field (or generatable item). For the field or generatable item, such a generative context determines how it is generated and/or its value. For example, coverage-related tactics have their context from coverage, such that the process of binding fits them together (layers them); other tactics are related to the process of generation itself and so do not have such a generative context.

Two non-limiting examples of some of the simplest tactics are the edge tactic (which involves using the maximum or minimum values of a range, or to minimum or maximum values of internal edges; the latter situation applies when a range is broken with subranges between which values are not permitted) and the repeater tactic. The edge tactic has the effect of causing the test generator to always pick boundaries; when it is used and how often depends upon the selector, which may optionally use a weighted selection, random selection or a simple queue to select each different type of tactic. The repeater tactic involves repetitions of the same value, alternating values and so forth.

Tactics are preferably prepared in advance. The selectors are preferably bound to tactics, optionally in advance or at run time. Selectors then run and select a tactic or tactics at the time of test generation. According to preferred embodiments of the present invention, there is provided a tactic manager which operates before and after a run, for generation (before) and analysis (after). The tactic manager preferably is used to cause the selectors to be bound to tactics, and to generally manage tactic selection and implementation.

Tactics are preferably implemented and managed according to one or more strategies. A strategy preferably features a plurality of tactics, with guidance for the operation of the tactics. A strategy may be viewed as a management tool; although tactics could optionally be implemented without a strategy, the strategy is preferably used to provide cohesion to the tactics, and also optionally to allow the user to more easily select a plurality of tactics for implementation. A strategy therefore preferably provides an interface for the user for activating tactic(s). Strategies are preferably shaped according to overall coverage goals, rather than being concerned only with specific technical details of specific coverage-determining mechanisms.

Tactics may optionally be selected and bound according to a local or a global policy. A policy is a process of binding tactics to fields and assigning probabilities, in order to perform a strategy. A global policy preferably includes a configuration of a tactic or several tactics, and prepares configuration and binding of the tactics. The global policy is preferably called in advance of test generation, and creates a database of tactics from external information. Optionally, this information may include data from other strategies. The generator then starts test generation and seeds are given values; and after each run, a post run analysis is performed. Preferably a global policy creates the environment, while local policies include what are bound to a specific seed. Also, preferably a local policy receives a range from a seed and then limits it according to possible tactics.

Coverage filling is an example of a more complex tactic, in which the coverage captures the state of previous occurrences in previous run(s) and reports this information to the user. Coverage filling is preferably performed with a "filler" or coverage item as described in greater detail below. Preferably information is shared over multiple runs. Each specific generation itself involves the creation of a per test behavior within the envelope determined by the user but in a creative/flexible manner. The user can optionally describe statistically important ranges or distributions for better coverage with regard to user understanding for coverage filling. Coverage may be larger or created (collected and analyzed) over several tests.

Coverage is preferably analyzed according to each type of variable, as well as according to subtypes if present. For example for a general type of packet, under which a subtype of packet is classified, the subtype packet needs to be sampled according to its subtype, but also as an example of a general packet. Coverage goals are optionally and preferably determined for both the type and the subtype, such that each preferably represents a separate coverage item.

Each type is preferably weighted according to sampling and according to what happened during a run. Each type may optionally have multiple weights, each of which is related to a particular filler. Each filler is a single coverage item with ranges (values) to be filled. The filler tries to fill the range according to a previously determined frequency, and/or a statistical distribution etc, preferably after an analysis of coverage "buckets" which are still unfilled or not sufficiently filled. A filler is different from a tactic, because each tactic relates to a particular field, while each filler relates to a coverage item.

A complex coverage item may be a transition which collects information about current coverage according to previous test generation(s) and is therefore time dependent. A cross coverage item is another example of a complex coverage item; it preferably includes information from several fields, but is complicated because the second or subsequent field(s) (or condition(s)) may not be reached. The plurality of fields may optionally be used at one time, or alternatively may be temporal, in which generation of a later field value depends upon generation of a value for a previous field. The filler for the cross coverage item preferably is associated with the cross between the plurality of fields, rather than being associated with the field itself, again showing the difference between tactics and fillers. Furthermore, if a coverage item is filled by a previous action, and the filler is invoked for the cross coverage item, a more complicated pattern may optionally be performed by invoking one or more tactics.

A cross preferably is able to reach a particular field in order to provide a value for that field as part of the generation process. The cross does not itself cause certain values to be generated, but rather causes tactics to be invoked in order for a value to be generated for the field. The use of crosses preferably permits the use of temporal and spatial patterns at the same time. Statistical and heuristic analyses may also preferably be performed at the same time.

Within each maximization session, the maximizer engine optionally and more preferably alters selected tactics to attempt to continually increase coverage throughout the session. For example, the maximizer engine preferably starts the session with a relatively simple tactic, such as filling input coverage holes. Input coverage can optionally be directly affected by the generator, because it is the output of the generator. For example, if there is a hole associated with a bad packet with data length of 10, the constraints can be adjusted to generate such a packet with a much higher probability. As the session continues, the maximizer engine preferably uses more complex tactics and/or groups of tactics, more preferably once the simpler tactics have exhausted their goals. It should be noted that for the purposes of the present invention, a record of a previous maximization session may optionally be made and incorporated into a subsequent maximization session, such that the adjustment of tactics may optionally be continued from the previous session. Thus, the maximization session may optionally include a plurality of such sessions.

Optionally and preferably, each session is controlled by a session engine, while each test is preferably run by a run time engine. The session engine preferably manages each session, which contains a plurality of runs, according to one or more policies as described below. The policies preferably act as an interface to the session engine, for the activation of strategies during the runs. Also optionally and preferably, after each run, post-analysis is performed for analyzing coverage, more preferably according to the requests of the user, for example to determine why a particular cross did not provide the expected results. The analysis optionally and preferably includes determining why a particular range was not examined, for example by differentiating between a range which is allowed but for which values were not chosen, and a range which is not allowed.

For the runtime engine, the interface is provided through strategies, which apply to the activation of tactics on generations in the run. The flow of operation preferably includes extraction of runtime data, activation of tactics to match strategies, and analysis and reporting functions at the end of each run.

According to a preferred embodiment of the present invention, test generation is performed in a verification environment which preferably includes coverage driven verification methodology. This methodology involves the definition of at least a coverage model, preferably with at least one stand-alone checker. The coverage model guides the function of the maximizer engine of the present invention. The checker then preferably examines the generated tests for correctness and also optionally and preferably for utility.

It is possible to write a test that only specifies a new cross to fill coverage holes, in order to avoid the situation where remaining coverage holes prove to be difficult to fill.

The verification environment also preferably includes restrictions in the form of at least one constraint and/or structure. These restrictions guide the generation process, such that the maximizer engine is guided and also restricted by these restrictions. Therefore, preferably absolute restrictions are minimized in the verification environment; rather, guidance for the maximizer engine is more preferably provided through the analysis of the coverage model and the function of the at least one stand-alone checker.

According to an optional embodiment of the present invention, the behavior of the verification environment itself is examined through operation of the maximizer engine, for example by defining coverage points within the verification environment.

For example, optionally and preferably, the verification environment itself may be refined over a plurality of maximization sessions. For this optional but preferred implementation, the refinement process starts with a verification environment, optionally with a previous coverage base as input. As described above, such a previous coverage base may optionally be obtained from the operation of at least one previous maximization session, with the coverage results of that at least one session forming the coverage base. Next, the maximization session is performed until some type of threshold is reached, more preferably a coverage gain threshold which may optionally be user defined. Next, optionally manual input is received from a human operator, for example in order to manually increase coverage by manually directing the test generation process.

If verification goal(s) have been met, then the refinement process may optionally be halted. The human operator may then optionally again provide manual input, by analyzing the remaining coverage hole(s) and adding generation infrastructure to the verification environment to direct the test generation process to cover these hole(s). For example, the manual input may optionally be in the form of strategies. For example, if the system fails to cover a particular internal state, the user may provide a strategy that leads to that internal state. The same strategy can facilitate the collection of other coverage goals as a side effect and/or constraints.

According to other preferred embodiments of the present invention, the maximizer engine also directly influences input coverage, by controlling the output of the test generators.

According to still other preferred embodiments of the present invention, an iterative process may optionally be used during a session, which also allows the session to optionally be repeated. On the other hand, at least one or more iteration(s) during a session may optionally be avoided by adjusting the test generation process during the session.

The present invention features a method for maximizing coverage of a device under test (DUT) in a test environment during a test verification process, which could also optionally be used to minimize failure (i.e. to maximize a lack of failure).

BRIEF DESCRIPTION OF THE DRAWINGS

The attached figures illustrate certain aspects of the invention but are not meant to be limiting in any way.

DETAILED DESCRIPTION OF THE PREFERRED EMBODIMENTS

The present invention is of a method and apparatus for managing test generation and examination of test coverage so as to most efficiently obtain maximum coverage during test generation. The present invention also preferably provides tactics, optionally managed through the use of strategies, for generation as part of such management. Thus, coverage providing by test generation and execution is not only measured, but is also preferably obtained in a more efficient manner by enabling the coverage maximization functions to provide feedback and management to the test generation process.

Tactics alter generation according to some defined mechanism. As previously described, the mechanics of implementing tactics preferably involve associating the tactic with a field or other generatable entity according to the seed domain, more preferably through the use of a selector. The selector operates in a probabilistic manner for causing the tactic to be invoked. These entities are all preferably managed through policies that are more preferably user defined. Policies also define the probabilities associated with every selector. Policies can preferably consider the current state of generation, by sampling some data at the analysis stage and altering the binding of selectors and tactics for future runs.

For the ease of users, preferably tactics can be managed through strategies. A strategy may optionally feature one or more instructions for implementing tactics, and/or general coverage goals, and/or portions of tests or even complete tests. The strategy preferably provides a management tool for the user, rather than requiring the user to implement particular tactics. The user is also preferably able to manage policies through strategies.

The present invention preferably directs the test generation process in order to maximize coverage. Coverage maximization is now preferably an integral part of the test generation and execution process, rather than being mainly implemented as a metric for examining coverage after test execution. Furthermore, coverage maximization also preferably is used to analyze the testing strategy, in order to create more efficient and effective tests during the test generation process.

The present invention optionally and preferably operates within a verification environment, which provides permitted or legal input to the DUT (device under test) and which also provides at least some of the generation mechanisms for generating tests to be executed by the DUT, in order to be able to exercise the functions of the DUT and their boundaries to examine the behavior of the DUT. These boundaries are in turn examined by using constraints in the tests.

More preferably the test structure is determined as a generalized scenario rather than as a single test. Preferably, one or more scenarios are defined for the operation of the present invention. These scenarios undergo a generation phase to create a "program instance" or a test program as described above. The program instance then undergoes generation to create a test instance (or test) as in the background art.

The process of using scenarios for test generation preferably starts by inputting one or more scenarios by the user and/or otherwise providing the scenario(s). These scenarios are provided with (optionally) one or more meta data elements and one or more constraints, indicating at least which scenarios may be combined together in a particular test program, and which are in conflict. Preferably, the constraint(s) are also provided for the test generation itself, as described in greater detail below. A selection is then made from these scenarios, including at least one such scenario but preferably including a plurality of (non-conflicting) scenarios. This selection is done by resolving the constraints associated. The selected scenario(s) are then combined in a combination phase, to form a combined scenario instance. This combination is then used to generate a test program at run time, in a generation phase, which is actually a continuation of the combination phase but is described separately for the purposes of illustration only and without any intention of being limiting.

Generalized scenarios have a number of advantages over single tests for operation with the present invention. For example, these scenarios may optionally be loaded together and mixed for a test run as described above, thereby providing richer stimuli to the DUT and potentially increasing test coverage. Generalized scenarios may optionally be selected according to a selection process, as described above, which is preferably parameterized such that selection is preferably at least partially driven or directed rather than being completely randomized. Such directed selection may optionally be performed according to the constraints. Also, generalized scenarios enable the tests themselves to be more easily analyzed, since they describe general guidance for test generation, such that the effect of the underlying structure may be more easily analyzed with scenarios than with actual tests.

According to a preferred embodiment of the present invention, the maximizer engine operates during test generation in a maximization session, which preferably involves the generation and execution of a plurality of tests. More preferably, the maximizer engine directs the use of generalized scenarios to generate a plurality of tests as previously described. After some type of condition has been met, such as the execution of a particular number of tests (test runs) and/or overall iterations of the test run process, the maximizer engine then examines the coverage afforded by the test runs. The engine then preferably directs the next iteration of test runs, for example by optionally generating inputs to the test generation process.

Other examples of end-point conditions include, but are not limited to, the amount of time to be spent executing test runs, a minimum amount of coverage gained, a coverage grade target, and/or execution of the available set of generalized scenarios.

Preferably, the maximizer engine directs the performance of test runs (generation and execution of tests) according to one or more tactics. A tactic causes a particular behavior to be implemented during test generation, as applied to the selection of one or more values during generation, thereby altering the selection process. Within each maximization session, the maximizer engine optionally and more preferably alters these tactics to attempt to continually increase coverage throughout the session. For example, the maximizer engine preferably starts the session with a relatively simple tactic, such as filling input coverage holes. As the session continues, the maximizer engine preferably uses more complex tactics and/or groups of tactics, more preferably once the simpler tactics have exhausted their goals. It should be noted that for the purposes of the present invention, a record of a previous maximization session may optionally be made and incorporated into a subsequent maximization session, such that the adjustment of tactics may optionally be continued from the previous session. Thus, the maximization session may optionally include a plurality of such sessions.

According to a preferred embodiment of the present invention, test generation is performed in a verification environment which preferably includes coverage driven verification methodology. This methodology involves the definition of at least a coverage model, preferably with at least one stand-alone checker. The coverage model guides the function of the maximizer engine of the present invention. The checker then preferably examines the generated tests for correctness and also optionally and preferably for utility. More preferably, the checker itself acts as an overseer for the maximization engine and therefore is able to increase the value of maximization of test generation.

The verification environment also preferably includes restrictions in the form of at least one constraint and/or structure. These restrictions guide the generation process, such that the maximizer engine is guided and also restricted by these restrictions. Therefore, preferably absolute restrictions are minimized in the verification environment; rather, guidance for the maximizer engine is more preferably provided through the analysis of the coverage model and the function of the at least one stand-alone checker.

According to an optional embodiment of the present invention, the behavior of the verification environment itself is examined through operation of the maximizer engine.

For example, optionally and preferably, the verification environment itself may be refined over a plurality of maximization sessions. For this optional but preferred implementation, the refinement process starts with a verification environment, optionally with a previous coverage base as input. As described above, such a previous coverage base may optionally be obtained from the operation of at least one previous maximization session, with the coverage results of that at least one session forming the coverage base. Next, the maximization session is performed until some type of threshold is reached, more preferably a coverage gain threshold which may optionally be user defined. Next, optionally manual input is received from a human operator, for example in order to manually increase coverage by manually directing the test generation process.

If verification goal(s) have been met, then the refinement process may optionally be halted. The human operator may then optionally again provide manual input, by analyzing the remaining coverage hole(s) and adding generation infrastructure to the verification environment to direct the test generation process to cover these hole(s). For example, the manual input may optionally be in the form of strategies and/or constraints.

According to other preferred embodiments of the present invention, the maximizer engine also directly influences input coverage.

According to another optional but preferred embodiment of the present invention, one or more maximization policies are determined, each of which preferably features a plurality of tactics for a maximization session. The maximization session (and the function of these tactics within the session) may optionally be specified according to a maximization script. Policies are preferably selected by the user and/or may optionally be input by the user through one or more strategies, for management of tactics.

Examples of maximizer tactics include, but are not limited to, input coverage filling, stimuli pattern modulation and correlation based maximization. These tactics are described in greater detail below. Both input coverage filling and stimuli pattern modulation tactics are local to maximization sessions, and are preferably implemented from within the maximizer generator. The correlation based maximization tactic, however, preferably has a global view of all of the test runs and their results. Also, the input coverage filling and the correlation based maximization tactics are coverage directed tactics. The first of these tactics preferably uses input coverage only, while the second tactic preferably uses the total coverage model. Each such tactic is described in greater detail below, along with optional methods for controlling the maximizer engine in order to perform each tactic.

According to a preferred embodiment of the present invention, input coverage filling is preferably performed by targeting input coverage specified by the user. The filling of such coverage is preferably done by the maximization engine. This method allows the user to directly control the distribution of generated stimuli by adding the desired input coverage to the verification environment. The maximizer engine more preferably ensures that the relevant input coverage "buckets" (goals) are filled, as long as these buckets are reachable within the constraint set. The maximization session or sessions are then directed to fill the coverage buckets, filling of which preferably forms at least one threshold for stopping the generation process (since the maximizer engine may fail to fill the buckets, preferably there is at least one threshold related to time and/or an absolute number of runs, to avoid a process without a clear end).

If the maximizer engine fails to fill the desired input coverage, there may be one or more reasons which are then preferably overcome by further actions during or after the maximization session. For example, the verification environment may be subjected to too many constraints (over-constrained), in which case the constraints may optionally be reduced. Biasing may occur during the test generation process (generation biasing), for example due to excessive "or" constraints; this may be addressed by using soft select, which involves changing the relative weights to favor some cases over others) and influencing the generation order.

Controlling the maximizer engine for this tactic preferably involves directing input coverage filling, by directing the maximizer engine to those areas specified by the user. For example, such direction may optionally include selecting specific input coverage groups or items, and instructing the maximizer engine to fill them. Optionally (additionally or alternatively), a particular coverage group may be constructed in order to direct the maximizer engine to explore a particular area, for example by defining a group that directly measures some aspect that is lacking in coverage. By making this an explicit group, the maximizer gains visibility and can target the missing coverage. Also optionally, such constructed coverage groups may be set experimentally to have more aggressive coverage goals, for example by including more "cross" items (see below for an example of such a cross item) and/or by having a higher threshold set for minimum coverage to be achieved.

According to another preferred embodiment of the present invention, the tactic of stimuli pattern modulation preferably uses one or more selected, optionally heuristic, verification practices, such as exploring corner cases and boundary conditions. This tactic is not coverage driven; instead the maximizer engine modulates the stimuli patterns within the rules determined by the constraints and the general verification environment. Optional, non-limiting examples of suitable tactics include creating extreme values or "edges" or creating sequences of repeated values ("repeater") for fields of the same object in context. Edges are the range boundaries imposed on the value of a variable by constraints. Optionally, the repeater tactic may inherit its initial value from other tactics. Also optionally, the repeater tactic may involve incrementing or decrementing values. Examples of edge tactics include but are not limited to, dynamic edges, in which the boundaries of the range of a field as determined at run time are generated; and static edges, in which these boundaries are determined statically (before run time), although optionally including both the possible values that may be assumed and also its usage (i.e. capturing both pre-run edge values and runtime edge values, while noting each type of value). Another non-limiting example of a tactic would be application of a bit pattern to fields that are interpreted as bit vectors, in which after each zero value, a string of N bits with "1" value would be expected.

Stimuli pattern modulation may optionally be directed by applying the above tactics to generatable fields of interest. For example, if the queue manager function is of interest, then these tactics are preferably applied to fields in structs which influence the queue manager function such as the density of objects sent into the queue, their lengths and so forth.

According to still another preferred embodiment of the present invention, the policy of correlation based maximization correlates input scenarios to the achieved goals, and directs the next runs to obtain more "good" scenarios, by selecting those scenarios which are most likely to produce good coverage as based upon the analysis of previous runs. However, such analysis optionally does not involve an attempt by the maximizer engine to "understand" why the coverage is maximized; instead, the coverage grade itself is preferably correlated with the selected scenarios. Thus, correlation is preferably performed between input scenarios and total coverage according to the coverage grade. The input scenarios may optionally include constraint files (sets of constraints); tactics; policies; and input coverage items.

According to a first optional embodiment of the correlation strategy, an overall coverage grade is measured and one or more effective scenarios are selected according to the grade. Scenarios which fail to achieve a threshold coverage grade after a threshold number of runs are preferably dropped. According to a second optional embodiment of the correlation policy, the user optionally specifies a target internal coverage item and correlates it to a known input coverage item; the maximizer engine then preferably uses information obtained from the behavior of the known (input) coverage item to maximize the coverage obtained for the target coverage item.

For example, the maximizer has good control over the generated input (which is the output of the test generator). For coverage goals internal to the DUT, a correlation is sought to some input coverage. This correlation can be identified automatically or indicated by the user. Based on this correlation, the maximizer preferably adjusts or "tweaks" the input in an attempt to reach the correlated internal goal. For example, such a tactic could optionally be used to increase the likelihood of obtaining coverage for an internal cross coverage of two variables (X, Y). If the bucket determined by the ranges (Xn, Ym) is never hit, but the maximizer engine is able to identify input parameters which increase the likelihood of Xn being reached and Ym being reached, then the maximizer engine may optionally and preferably apply maximization of each separate part of the internal cross, in an attempt to increase the likelihood that the bucket (Xn, Ym) is reached. Thus, this tactic is useful even if the maximizer engine cannot guarantee the directed generation of values that would definitely cause (Xn, Ym) to be reached in the internal cross.

Correlation maximization is preferably directed by selecting particular coverage goals as the measure according to which the scenarios are graded.

As a non-limiting example, the above tactics may optionally be used with a verification environment in the e verification language, as previously described. The general syntax for using a tactic for this non-limiting example is as follows:

```
config_tactic_activation(
    tactic_name: mxi_tactic_t,
    item: string,
    options_and_values: list of string);
``` in which the name of the tactic is given as the value for tactic_name, the coverage item is given as the value for item and the various options for the tactic are given as options_and_values. Permitted values for item may optionally depend upon the tactic itself. For example, for the direct input coverage filling tactics, the item is preferably a coverage item having a regular expression in the form of <struct>.<cover_group>.<item>. For edge tactics and other tactics that operate on generatable items, the item parameter is preferably a struct regular expression in the form of <struct>.<field>.

For a typical maximization session, multiple tactics may optionally be specified. Preferably, arbitration is performed in case of conflict, for example if multiple tactics are specified for a particular field, in order to determine which tactic has precedence. The priority of tactics is preferably defined such that a higher priority tactic is the only one considered unless it lacks specific requirements at the specific point of field generation. For example, the tactic priority for the following four tactics may optionally be set as follows:
1. repeater
2. input hole fill
3. edges
4. input flat distribution, which gives the same probability to all permissible values for this input Tactics are optionally and preferably validated, in the sense that the actual generated values are examined in order to verify that the tactic has been followed. For tactics having their effect on fields, failure to follow the tactic indicates a problem in the generation process itself. For complex tactics, failure may have multiple causes and so the tactic needs to be analyzed separately.

A maximization session may optionally be constructed from multiple phases, each phase preferably featuring one or more iterations. The sequence of phases optionally and preferably starts from simple tactics and then progresses to more advanced tactics, and may also optionally operate according to one or more policies. Preferably, these phases are detailed in a maximization script as previously described. Each such phase is preferably described in the script with a set of tactics to be activated, for example as described above with regard to the e language, optionally with a percentage of the resources to be used for each tactic. Preferably, the script also includes the conditions under which the phase is considered to be completed. The maximization script and its parameters may optionally be encapsulated into a strategy. Illustrative parameters for the strategy may optionally include target internal coverage groups, for example. The strategy provides a management tool for the user, to enable the user to more easily select and/or implement tactics.

According to preferred embodiments of the present invention, reports and analysis of the performance of the maximization engine are generated. For example, these reports and analysis may optionally provide information as to why the maximization engine cannot reach certain coverage goals. Examples of different types of analyses that may optionally be provided with the report include but are not limited to, range analysis and other types of coverage analysis. Such analysis allows one or more tests to be created according to coverage, which was not previously possible.

Range analysis may optionally be performed to compare the valid coverage area defined by the coverage items to possible range(s) of the fields associated with these items at generation time (generative range). For example, for the e language, the type range of a field F is the set of possible values defined by the type of the field. Some non-limiting examples of fields F and their ranges are given below:

```
F: uint;                      -- type range is [0 ... MAX_UINT]
F: int(bits: 4);              -- type range is [-6 ... 7];
F: [red = -3, green = 1];     -- type range is [red, green] == [-3, 1]
```

The generative range of a field F is the set of possible values defined by the type of the field for generation, intersected with the type range. Some non-limiting examples of fields F and their generative ranges are given below:

```
F: uint[2 ... 100];           -- generative range is [2 ... 100]
F: int(bits: 4) [-100 ... 2]; -- generative range is [-6 ... 2];
```

The coverage range of a field coverage item corresponding to a field F is the union of all its buckets (without taking into consideration any 'illegal' or 'ignore' expressions). The static (generative) range of a field F with respect to an environment or a specific test file (constraint set) is its range after resolving all statically analyzable constraints on that field. Some examples are given below:

```
F: uint[2 ... 100];
keep F > 31;                -- static range is [32 ... 100]
F: int(bits: 4) [-100 ... 2];
keep F != 0;                -- static range is [-6 ... -1, 1 ... 2];
```

It should be noted that generation of the value of a field may be performed through range reduction, which limits the possible range of values from the initial range according to one or more constraints. Range reduction may be static, for example to determine coverage buckets (a sub-range of functional significance), or dynamic, as determined according to a current dynamic range (such as current maximum and minimum values).

Figure 1A:
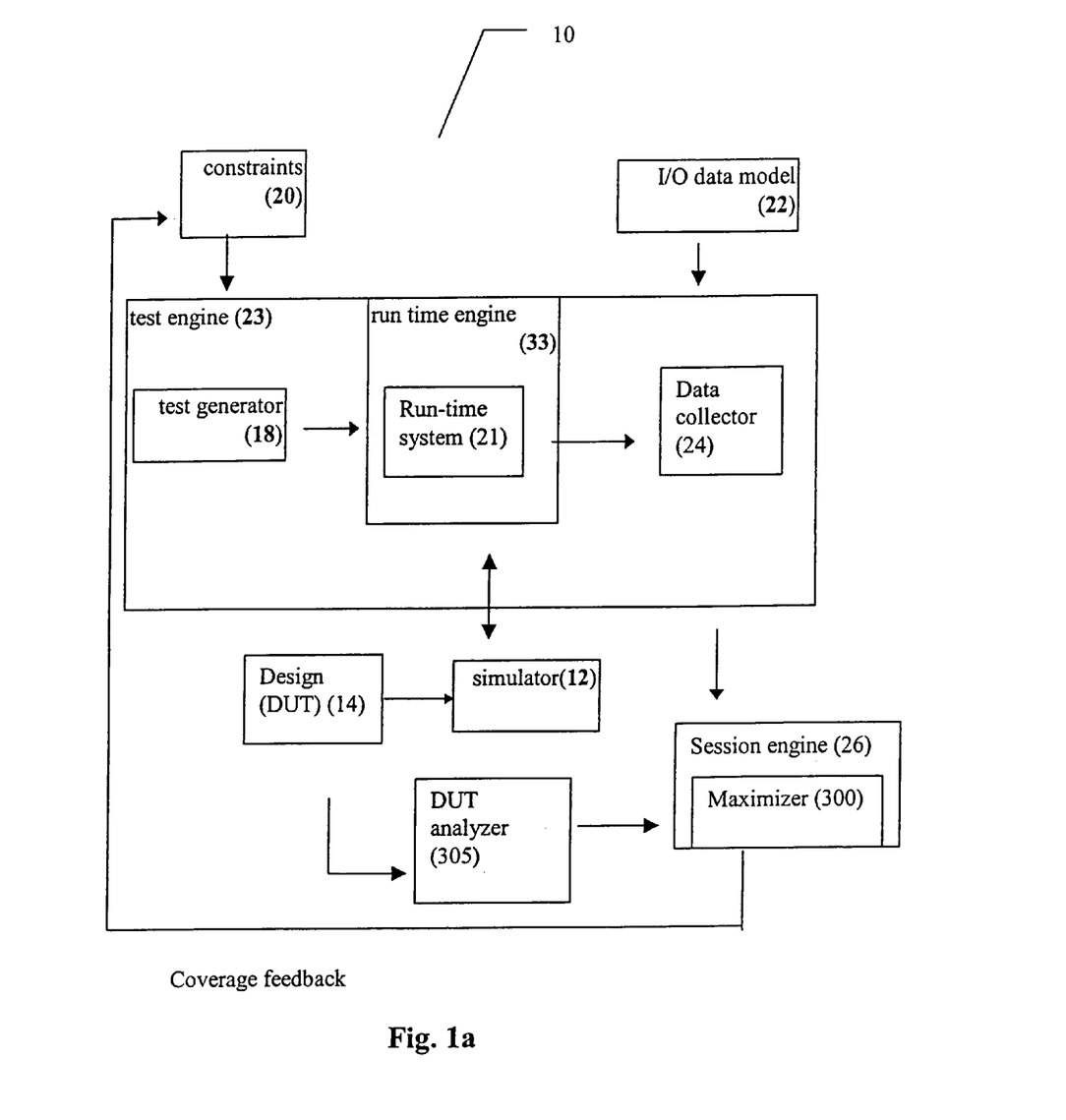
FIG. 1 shows an exemplary embodiment of a system according to the present invention.

Referring now to the drawings, FIG. 1A is a schematic block diagram illustrating an exemplary system according to the present invention for test generation. It should be noted that the illustrated system only includes those general functions of the test generation procedure which are required for the description of the present invention. A more complete description of the entire test generation procedure may be found in U.S. patent application Ser. No. 09/020,792, previously incorporated by reference. It should also be noted that although the present invention is described in the context of a simulation model, the present invention is also useful for verification of a physical device. Both the physical device and the simulation model can be described as a DUT (device under test), which is in a test environment.

A test generation system 10 according to the present invention features a simulator 12, which may accept a design 14 for the device under test (DUT), written in a hardware descriptive language such as Verilog or VHDL. In addition, simulator 12 interacts with a test engine 16 for performing the test generation procedure at run-time. The interaction between simulator 12 and test engine 16 is shown as bi-directional, since test engine 16 provides input to simulator 12, and in turn receives the results from simulator 12 as input for further operation.

Test engine 16 features a test generator 18, connected to a run-time system 21 and run-time engine 33 for testing DUT 14 at run-time. Test generator 18 receives a set of constraints 20 and an I/O data model 22, and then performs the testing and verification of DUT 14. According to the present invention, constraints 20 include at least one set of a plurality of dynamic constraints, which are then solved according to the method of the present invention, as described in greater detail below. Run-time system 21 both drives and samples simulator 12 during the run-time testing procedure. Run-time engine 33 preferably controls the overall process during run-time. Also, session engine 26 preferably communicates with run-time engine 33 for extracting data for analysis of each run, and also more preferably analysis of each session as previously described. Most preferably, such data is provided through a data collector 24.

During the process of testing and verification, data collector 24 preferably requests the values for one or more variables from run-time system 21. These requests are optionally performed according to a triggering event emitted by run-time system 21. For example, for collection of data related to temporal coverage, such a triggering event is optionally a fixed, predefined sampling time and/or the occurrence of a temporal pattern of state transitions as defined by a temporal expression given in a temporal language, for example. Data collector 24 is able to communicate with test generator 18 and to access the requested data through the API (application programming interface) for test generator 18. Such an API specifies the software function calls required in order to collect the desired data. This collected data is then analyzed by a session engine 26.

According to the present invention, session engine 26 features a maximizer engine 300, for maximizing test coverage. As described in greater detail with regard to FIG. 1B, maximizer engine 300 preferably receives information about DUT 14 from an optional analysis module 305 and various tests from test generator 18. This information is then used to create new tests and/or adjust one or more constraints at constraints 20. According to a preferred embodiment of the present invention, constraints 20 and I/O data model 22 are preferably constructed in e code, which is the code language provided by the Specman™ functional programming environment (Verisity Design, Inc., Mountain View, Calif., USA) and disclosed in U.S. patent application Ser. No. 09/020,792. Such an embodiment is preferred because of the ease and flexibility of programming in e code.

The e code language is a hardware-oriented verification specific object-oriented programming language. Objects in this language are instances of "structs", which contain a field, and one or more functions, or methods, which operate on data stored within the field and which interact with other objects. Optionally, a constraint can operate on the field, thereby altering the data stored in the field, for example by restricting the range of possible values for the data. The field can also be used to store more complex structures, including other structs and lists of scalars or structs.

The process of test generation fills data elements, including structs and fields, with random values. The possible data values for each element can optionally be limited by constraints, which provide the direction for the directed test generation. For dynamic constraints, as described in greater detail with regard to FIGS. 4 and 5 below, a selected, specific solution is provided according to the present invention for each instance of test generation. This solution is then used to provide limitations on the generated data values.

Figure 1B:
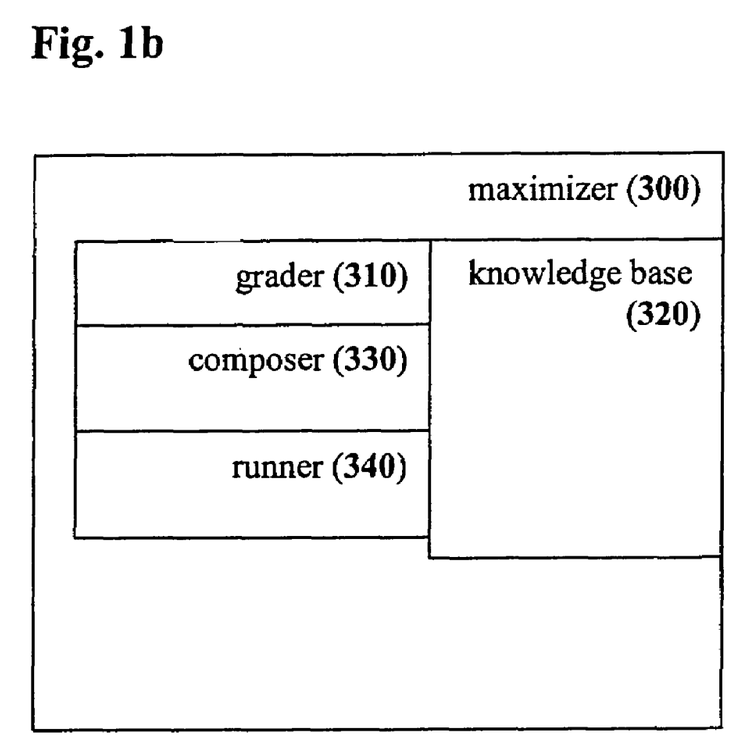

FIG. 1B shows an exemplary implementation of maximizer engine 300 in more detail. Maximizer engine 300 features a grader (or extractor) 310 for receiving the input test set (for input to test generator 18 of FIG. 1A), and optionally the designated goals. Grader 310 then preferably consults and updates a knowledge base 320 in order to perform such functions as feature detection, feature grading, and goal detection. Feature detection is preferably performed by extracting new features which could be used for implementing a tactic, and/or otherwise changing the generation process. Grader 310 also preferably prepares the internal data structure for analyzing coverage.

According to other preferred embodiments of the present invention, goal seeking heuristics are performed. For example, the mechanism for finding coverage holes in general stimuli is one example of such an operation. With regard to goal detection, these new goals are optionally detected from a given set of goals as follows. First, the goals may optionally be extracted by logical inference:

to achieve A or B one might want to achieve A or achieve B to achieve A and B one might want to achieve A and achieve B if it is known that A=>B that to achieve A. one might want to achieve A (with some probability)

if it is known that A=>~B, one might want to achieve ~A in order to achieve B In addition, temporal logic inference may optionally be used to discover new goals as follows:

if A leads to eventually B, one might want to achieve B (when the goal is B if A and B (in any order) lead to C one might try to achieve A and B (in whatever order)

Of course, past experience could also be used, for example in order to obtain information from knowledge base 320, particularly with regard to statistical past experience relating goals to sub-goals. Such past experience may be represented explicitly as a statistical function, or implicitly as a mutation probability or a synaptic weight in a neural network.

Next, a composer 330 preferably receives the results from grader 310 and composes and/or mutates test definitions for filling coverage. Composer 330 may also optionally consult knowledge base 320 before composing and/or mutating the test definitions. Optionally and more preferably, composer 330 operates at two levels: the session level for selecting policies, and at the runtime level for interacting with the test generator for generating tests. These test definitions are then optionally and preferably fed to a runner 340, which grades the actual composed tests and updates knowledge base 320. Runner 340 preferably also interacts with the session engine (not shown) for session management.

Features are preferably graded by using knowledge base 320 to measure the preferably weighted success for any given feature to determine a particular goal, given all detected features and emergent goals. An internal representation of this grading process is thus preferably fed to composer 330.

Knowledge base 320 itself preferably contains mappings from "feature building blocks" to goals, optionally according to one or more policies. These feature building blocks are more preferably determined according to strategies. A strategy may optionally and preferably feature an internal representation of a part of a test, for enabling the user to manage and/or select tactics more easily; for example, it can be (the equivalent of) a single generation action, a sequence of such actions, a generation and injection timed process (Time Consuming Method), or a full-blown test.

A strategy may optionally have a pre-condition specifying when it is applicable; it might be a simple Boolean precondition as well as a complex temporary expression and trace predicates (for both generation- and DUT-trace). Strategies are also optionally and more preferably parameterized, such that for example a strategy could be used for self registering N to zero (N is a parameter), or for causing integrated buffer J to overflow (J is the parameter).

Strategies preferably have a statistical measure relating them to one or more goals in order to measure efficacy and/or achievement.

Strategies may optionally be constructed recursively from other (sub) strategies using construction rules. Preferably, the same construction rules are applied to strategies "internally" and "externally", both for creating a new strategy and for combining strategies to form a new strategy.

FIGS. 1A and 1B illustrate an optional embodiment of maximizer 300 which has a basic set of functions, which can be described as "input-only" maximizer. In this implementation, all designated goals are features, such that all goals are described in the "input language", and thus are "solvable generated stimuli predicates".

Policies preferably provide role constraints and role generation-trace predicates. Roles are preferably used in order to simplify the situation in which a struct type might be generated in different contexts, with different constraints applicable to it and its descendants. A generation role is a conceptualization of this need for a "struct-type in context", or for being able to define the struct according to the context, such that the struct type is correctly generated according to both the definition of the struct and the context in which the struct is generated.

Optionally and more preferably, meta-random policies are used to augment the implementation of maximizer 300. The meta-random testing scheme enables the generation history of a field in a role to be affected using general heuristics and state definitions. For each role, statistical distribution of the generation in that role is preferably assigned. Such assignment may itself be done randomly or through analysis. When random assignment is used, a count is preferably assigned, indicating how many generations using this degree of randomness will be executed before a new assignment is made. This scheme is optionally and preferably implemented in conjunction with a constraint based test generation system such as Specman™.

Given a seed-domain, a range-list RL, and possibly (part of) the seed-domain's generation history, such randomness determines the way a new value will be generated for that seed domain. Other aspects may optionally be affected according to a policy. The following policies may optionally be implemented for example:

min—the minimal item in RL has higher probability max—the maximal item in RL has higher probability median—an item from "the middle" of RL has higher probability alt_min_max—alternating min and max have higher probability, starting with min alt_max_min—alternating min and max have higher probability, starting with max min_or_max—min or max have higher probability, randomly edges—a value that is an edge in RL random—random diff_then_prev—a value different then previous value has higher probability, if possible eq_to_prev—a value equal to previous value has higher probability, if possible uniq—a value different from ALL previous values has higher probability, if possible The policies also optionally and preferably have a number of features related to the ability to consider generation history. For example, 0-look-back is when the policy does not imply looking at generation history. 1-look-back is when the policy implies looking at last generated value only. unbound-look-back is when the policy implies looking at the whole generation policy.

Deterministic examples of these policies are given as follows.

```
0-look-back:
min ==> min(RL)
max ==> max(RL)
median ==> rl[ceiling(size(RL)/2)]
1-look-back:
alt_min_max ==> prev was min ? max(RL) : min(RL)
alt_max_min ==> prev was min ? max(RL) : min(RL)
```

For non-deterministic policies, 0-look-back is defined as follows:

```
min_or_max ==> rnd([min(RL), max(RL)]
edges ==> rnd(edges(RL))
random ==> rnd(RL)
1-look-back:
  diff_then_prev ==> rnd(RL[prev]) if possible
  eq_to_prev ==> [prev] if possible
unbound-look-back:
  uniq ==> rnd(RL-[all_prev]) is possible
```

Figure 2:
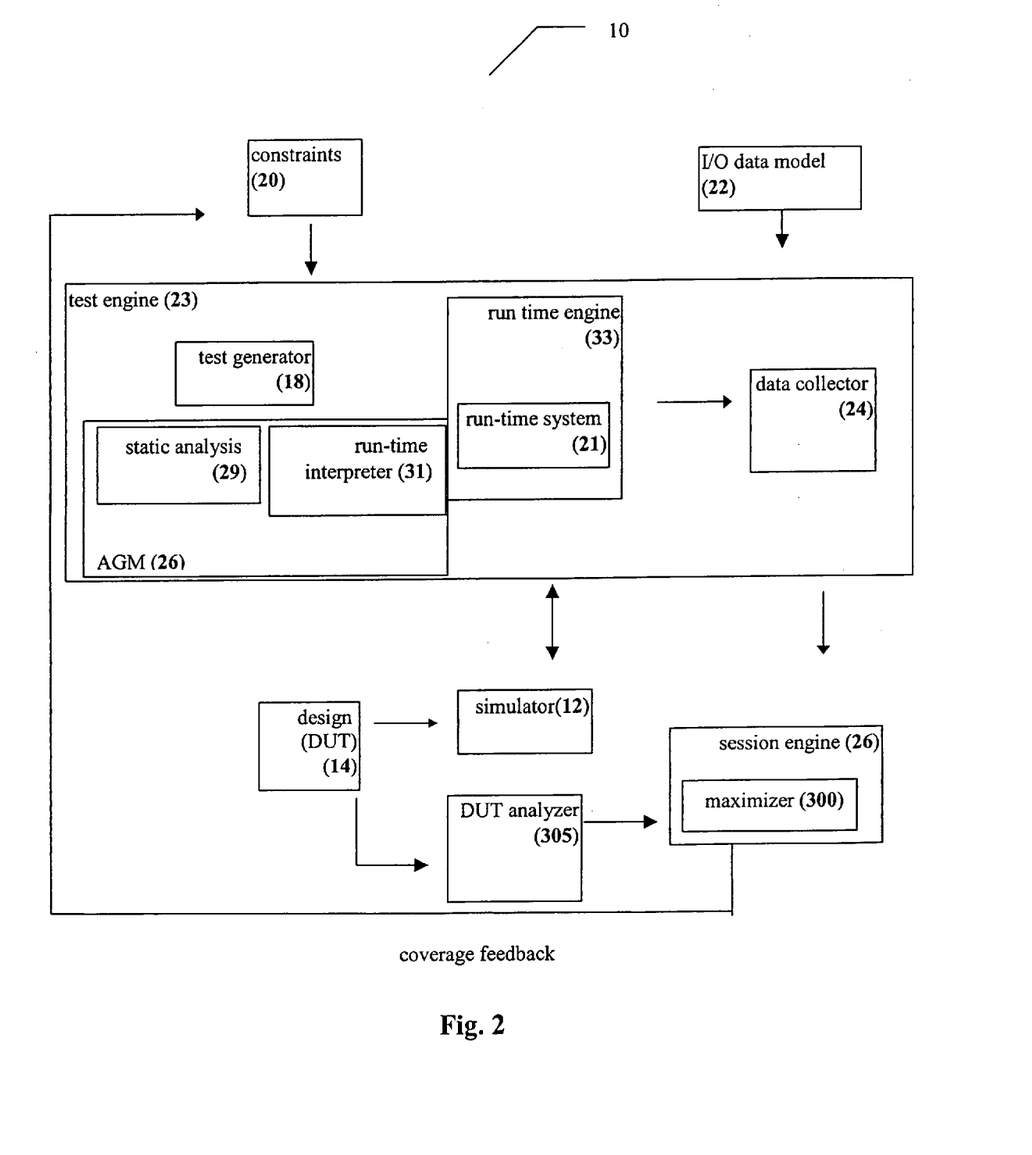
FIG. 2 shows the system of FIG. 1 with the addition of an exemplary AGM according to the present invention.

FIG. 2 shows system 10 from FIG. 1 with the addition of an AGM (abstract generation machine) module 26 for solving dynamic constraints. AGM module 26 creates a sequence of instructions in a "generator mini-language" (GML). These instructions are then executed in order to provide a correct random solution to any given set of dynamic constraints. Briefly, a static analysis module 29 preferably performs an initial analysis of the dynamic constraints before run-time, in cooperation with test generator 18. This initial analysis preferably produces a set of instructions for generating the correct, random solution. Next, a run-time interpreter module 31 preferably receives these instructions, and executes them in conjunction with run-time system 21.

Figure 3:
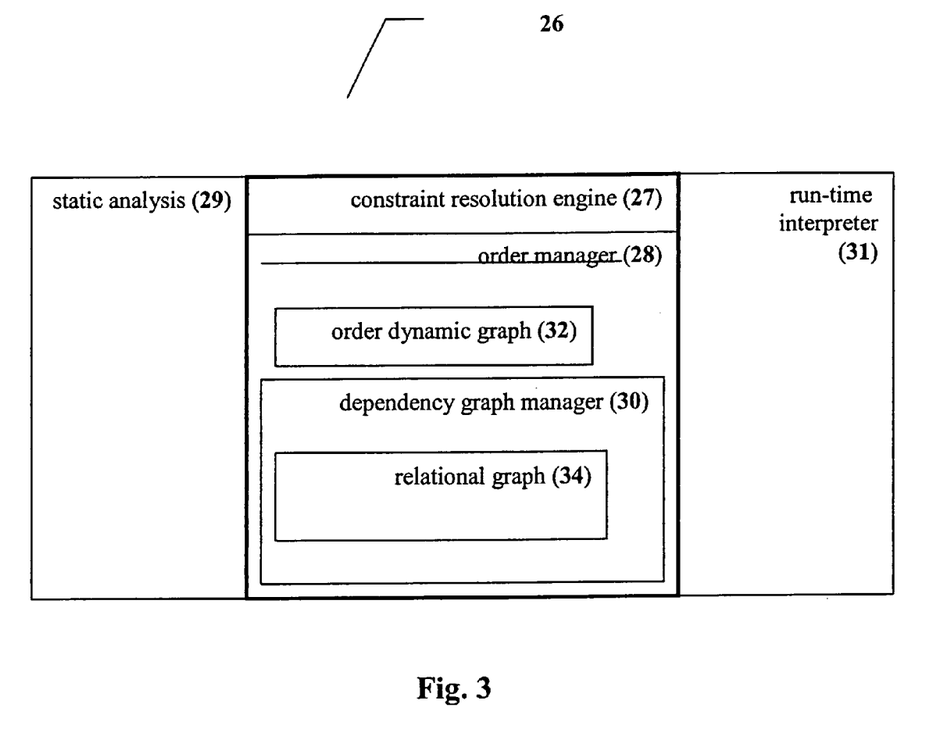
FIG. 3 shows the AGM of FIG. 2 in greater detail.

Turning now to FIG. 3, the schematic block diagram shows an exemplary but preferred implementation of AGM module 26 from FIG. 2. As shown, AGM module 26 preferably features a constraint resolution engine 27, in addition to static analysis module 29 and run-time interpreter 31. Constraint resolution engine 27 enables the process of resolving constraints to be at least partially performed before run-time, in the static analysis stage, thereby making the process of constraint resolution both more effective and more efficient. A set of instructions is then prepared for execution during run-time by constraint resolution engine 27. Thus, unlike the background art, which requires constraint resolution to occur during run-time, the present invention is capable of separating the process of constraint resolution into two stages: during static analysis (before run-time), after which a set of instructions is prepared; and during run-time, when these instructions are executed.

According to preferred embodiments of the present invention, constraint resolution engine 27 may optionally and preferably feature an order manager 28 and a dependency graph manager 30. Briefly, static analysis module 29 performs the initial analysis of the constraints for creating a set of instructions for execution in order to create the random solution, while run-time interpreter 31 executes these instructions.

Order manager 28 preferably maintains a dynamic graph 32 with bi-directional and uni-directional edges. Dynamic graph 32 is more preferably used to determine the order of incorporation of the instruction representing each constraint, according to the order which is implied between the nodes of dynamic graph 32. This order in turn is more preferably determined according to the set of provided constraints. Each node represents an instruction to be executed. Each instruction is in turn created according to the relationships between constraints, as determined by dependency graph manager 30.

Dependency graph manager 30 in turn optionally and preferably maintains a dynamic bi-partite relational graph 34 relating nodes and constraints. Each node represents field ranges for specific variables, for which particular values can be generated as part of the test generation process. Dependency graph manager 30 uses relational graph 34 in a process by which the consistency of ranges of legal values of the set of provided constraints is maintained, which is part of the reducing mechanism. Optionally and more preferably, dependency graph manager 30 is able to reduce the number of relationships which must be examined to maintain consistency.

Order manager 28 and dependency graph manager 30 together preferably create a static series of instructions according to commands from static analysis module 29, which, when executed by run-time interpreter 31, provide a solution to the set of constraints. This solution is more preferably provided as a set of values for variables. As previously described, if the e language is used to describe the constraints and the data model for test generation, then these values may optionally include data elements such as scalars, structs and fields.

As illustrated in FIGS. 2 and 3, system 10 has some additional advantages over the implementation of the system in FIGS. 1A and 1B. In particular, maximizer 300 and AGM 26 may optionally be described as cooperating according to the following process, in which the automatic coverage extraction performed by maximizer 300 uses the internal data representation and algorithm from AGM 26 to perform the following process.

First, generation roles are translated into coverage groups. Next, new e code for emitting an event corresponding to the generation of a struct in each role is produced. Then, each generatable field is translated into a coverage item. The initial range of values for a generatable field, inferred by static analysis, is defined to be the legal values for the corresponding coverage item.

Next, buckets are defined (and refined) for such items, using, in addition to other algorithms, the set of applicable constraints on that field in the role as inferred by Static Analysis. Thus, the extraction phase of maximizer 300 optionally and more preferably uses the following information, derived from static analysis: generation roles; generatable fields in role; initial ranges of generatable fields in role; and applicable constraints on generatable fields in role.

Static analysis preferably does not change the generation implementation, but rather optimizes generation and run-time operation for speed and efficiency.

Figure 4:
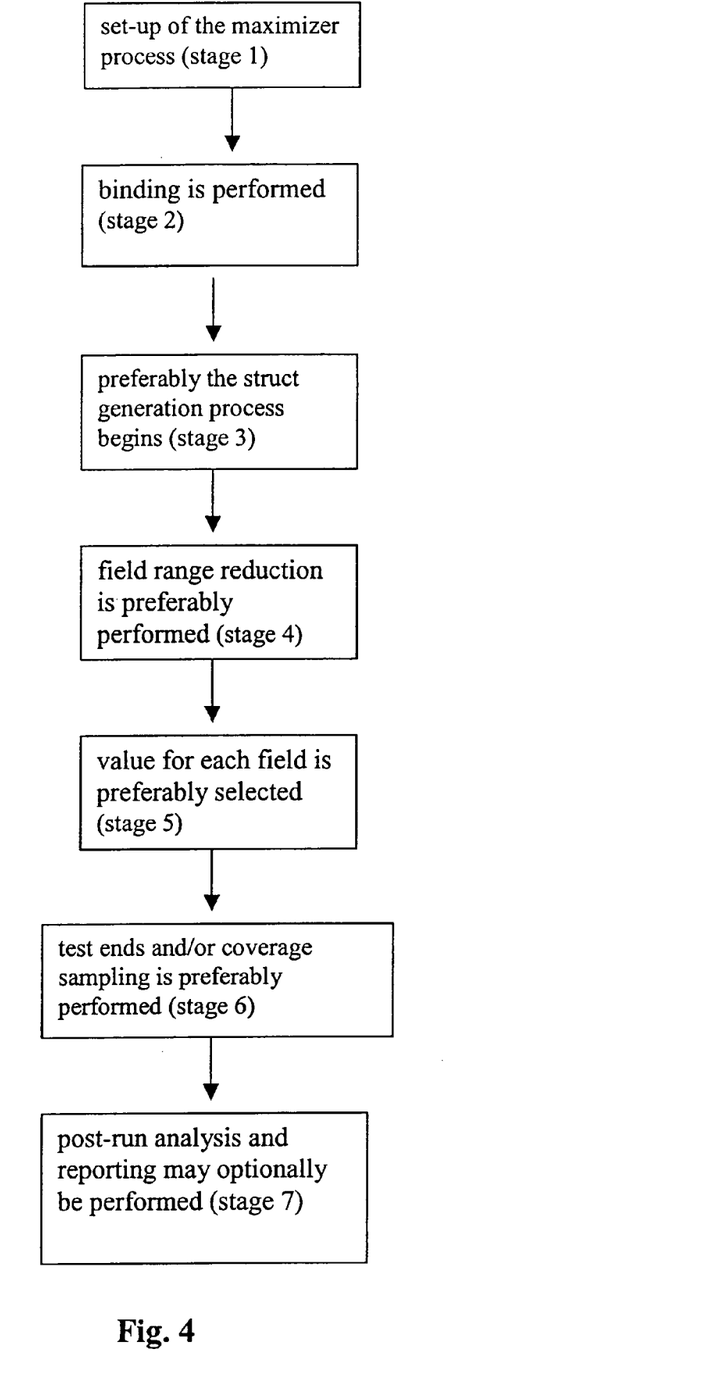
FIG. 4 is a flowchart of an exemplary method according to the present invention.

FIG. 4 shows a flowchart of an exemplary method according to the present invention. Overall, stages 1-3 are involved in preparation for generation, stages 4 and 5 are used for generation management, and stages 6 and 7 involve coverage sampling and post-run analysis. Stages 1-3 are optionally and preferably performed once in a session, while stages 4 and 5 are preferably performed as many times as each field is generated.

As shown, in stage 1, set-up of the maximizer process is performed. This set-up process includes initializing the manager of the maximizer. Also preferably one or more strategies are called to create or integrate one or more tactics.

In stage 2, binding is performed through connection to the selectors. Preferably, this process includes initializing seed domains. More preferably, each seed domain calls the manager for binding as it is initialized, although alternatively initialization occurs at the last possible moment before and/or during test generation (for example at each occurrence of stage 3 below). Initialization optionally and preferably occurs as the seed domain is used for generation. Initialization more preferably includes performing a binding request which contains the field name, type (and if available, subtype), and role. This information is then preferably used to locate one or more appropriate tactics for this seed domain.

Preferably, if a selector was prepared for the seed domain before the run, the manager locates the selector, which is optionally and preferably used for correlating and activating tactics (see below for an explanation). Tactics are preferably not bound directly to the seed domain, but instead are preferably bound to the selector(s). Binding to a selector enables tactics to optionally be selected and also enables multiple tactics to be more easily handled.

As part of the binding process, the manager preferably calls one or more suitable policies to perform dynamic acquisition, in order to determine which selectors are to be used and/or to guide the selectors. The results are preferably integrated so that only one selector is specified for each seed domain. The single selector is then bound to the seed domain.

The binding process itself may optionally be conditioned on some other occurrence, for example specifying that a tactic of a particular type is to be bound if it exists.

In stage 3, preferably the struct generation process begins. The manager is preferably updated with the current role for the generation process. As previously described, a role is used for being able to define the struct according to the context, such that the struct type is correctly generated according to both the definition of the struct and the context in which the struct is generated.

Next, preferably the generation process is performed for the fields. This generation process is more preferably performed in two parts: a first part for performing field range reduction, and a second part for selecting a value for the field. These two parts overlap, as it is possible to perform field range reduction until a value is selected for the field. However, for the present discussion they are described as two separate parts for the sake of clarity and without wishing to be limited in any way.

In stage 4, field range reduction is preferably performed. In this stage, dynamic range reduction is preferably performed as previously described. The seed domain is then preferably called with that range to select a value. If the seed domain is bound to a selector, the seed domain calls it with this range. The selector preferably arbitrates between all bound tactics, returning a non-empty sub-range.

A selector is bound to a single seed domain and is responsible for resolving and applying tactics to refine generation for that seed domain. The selector optionally and preferably serves as the interface for generation to the maximizer, at the seed domains. The selector also optionally and preferably resolves and applies tactics so that the choice at every generation is preferably optimal, and tactics are optimally applied over the entire run, such that conflicts between tactics are resolved.

Arbitration is preferably performed to resolve complex tactics, which cannot be performed statically (before the run) because they are determined by parameters that are outside of the generation of the current field, for example because they rely upon the generation of other fields. Therefore, their relationship for any particular test generation cannot be determined in advance. Also, some tactics on a single field may not be conflicting, since some values may satisfy many or all of them. Arbitration also enables these competing tactics to be resolved at each generation.

In stage 5, the value for each field is preferably selected, more preferably through random selection, although optionally value selection may be tweaked in this stage. Once the range has been determined in stage 4, a single value is selected from this range. Optionally and preferably, this stage may also be used as a binding point for tactics. If enabled, the value selection may optionally be overridden by one or more tactics.

In stage 6, the test ends and/or coverage sampling is preferably performed, more preferably as specified by the user. The latter may optionally be performed multiple times during the test. The manager is optionally updated that these events occurred. The manager then preferably calls any selector(s) bound to this event to perform validation and re-initialization.

More generally, stages 4 and 5 may be described as "field generation" stages, while stage 6 is for "field coverage sampling". Both of these are runtime phases which may optionally occur once, many times or not at all, at any time during the run with arbitrary correlation. The maximizer correlates them during the run. Optionally and preferably, coverage sampling is not necessarily correlated with the end of the run.

In stage 7, post-run analysis and reporting may optionally be performed. The manager optionally and preferably collects data and to prepare a report. The manager also optionally and preferably calls all strategies to inform them of the end of the run, for example to enable them to cache data. Also optionally and preferably, session analysis is performed at the end of each session.

The extractor itself is an optional but preferred component of the maximizer engine, which automatically extracts coverage points from the user's e code. The extractor extracts coverage items and buckets for this code. Cover item extraction rules preferably includes the following rules. An item is preferably created for:
  each generatable field in a role (including generation on the fly)
  size of lists
  each alternative in or (==imply) constraint, whether enforceable or not According to another embodiment of the present invention, the process of refinement is used to convert the range of (statically derived) legal values of an extracted item into coverage buckets. The user may optionally control the refinement process in several aspects, for example for edge refinement, in which a bucket is created for the range edges (boundaries) as previously described. The user could optionally control this process according to the following non-limiting examples:
  all edges:
  [1 . . . 10, 30 . . . 60]-->[1][2 . . . 9, 31 . . . 39][10][30][60]
  min/max edges
  [1 . . . 10, 30 . . . 60]-->[1][2 . . . 10, 30 . . . 59][60]
  no edges
  [1 . . . 10, 30 . . . 60]-->[1 . . . 10, 30 . . . 60]

The user could also optionally and preferably one or more of control edge size, interval refinement (non continuous intervals inside a range list might be separated into different buckets, for example [1 . . . 10, 30 . . . 60]-->[1 . . . 10] [30 . . . 60]).

The user could also optionally perform constraint refinement—if a constraint (typically a soft constraint or an or/when/imply alternative) implies a range for an item, the constraint itself could optionally be refined. Extraction heuristics may also optionally be performed, more preferably controlled according to user defined flags. For example, signed integers with both negative and positive values preferably always have [0] as a separated bucket; unsigned integers of bit size N should have intervals of bit size M (to ensure higher bits coverage); e.g, for N==7

M==5

[0 ... 127]-->[0 ... 31][32 ... 63][64 ... 95][96 ... 127]

Another such heuristic is preferably implemented such that if an extracted item corresponding to a field is also covered by a user defined coverage, these user-defined buckets are preferably used as the initial basis for refinement.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A method for maximizing coverage of a device under test (DUT) in a test environment during a test verification process, the method comprising:

determining at least one maximization strategy, said strategy featuring a plurality of tactics for directing test generation; and applying said plurality of tactics within said at least one maximization strategy with resolution to obviate conflicting tactics, until a coverage goal is reached, at least a portion of said plurality of tactics being adaptively applied responsive to test execution.

2. The method of claim 1, wherein said coverage goal is at least partially time-based.

3. The method of claim 1, wherein said coverage goal is related to a coverage area.

4. The method of claim 3, wherein said coverage area is determined according to correlation maximization.

5. The method of claim 3, wherein said coverage goal is related to overall coverage.

6. The method of claim 1, wherein said applying said tactics is at least partially performed according to a policy, said policy determining a probability of implementing at least one tactic.

7. The method of claim 6, wherein said policy is user-defined.

8. The method of claim 6, wherein said policy determines binding of a tactic to a field for said test generation.

9. The method of claim 8, wherein said policy alters said binding after a first test generation for performing a second test generation.

10. The method of claim 8, wherein said policy comprises a global policy for determining binding of a plurality of tactics to a plurality of fields before generation begins.

11. The method of claim 8, wherein said policy comprises a local policy for determining binding of a particular tactic to a particular field.

12. The method of claim 1, wherein applying said at least one maximization strategy comprises applying a plurality of strategies in a maximization session.

13. The method of claim 12, wherein said maximization session starts according to a data from a previous session.

14. The method of claim 12, wherein said coverage endpoint relates to coverage obtained during said maximization session.

15. The method of claim 1, wherein at least one tactic comprises an input filling coverage tactic for filling input coverage specified by a user.

16. The method of claim 1, wherein at least one tactic comprises a stimuli pattern modulation tactic for modulating a pattern of tactics according to at least one rule.

17. The method of claim 1, wherein said applying each tactic comprises: binding a selector; arbitrating between a plurality of tactics by said selector; and performing field range reduction according to said arbitrating.

18. A system for determining functional coverage of a device under test (DUT) in a test environment during a test verification process, the coverage metric being constructed from a plurality of coverage items, each coverage item having a variable, a value of the variable being determined for each test of the test verification process, the system comprising:

(a) a test generator for receiving at least one constraint for constraining the value of at least one variable and for generating the test according to the DUT; and (b) a maximizer for controlling generation of the test by said test generator according to at least one strategy, said at least one strategy comprising a plurality of tactics for directing test generation, at least a portion of said plurality of tactics being adaptively applied responsive to test execution.

19. The system of claim 18, further comprising: (c) a run-time system for running the test and for collecting data at run time; wherein said maximizer receives said data collected at run time for controlling said generation of the test.

20. A method for maximizing coverage of a device under test (DUT) in a test environment during a test verification process, each test featuring a plurality of generatable fields for test generation, the method comprising: binding a selector to each of the plurality of fields; binding a tactic to each selector for directing test generation; generating the generatable fields according to said tactic and said selector for a test generation; and adjusting said binding of said tactics and said selectors according to a result of said test generation, said tactic being thereby adaptively applied responsive to test execution.

21. The method of claim 20, wherein each selector has an associated probability for implementing said tactic.

22. The method of claim 21, wherein said adjusting said binding comprises adjusting said associated probability.

23. The method of claim 20, wherein said result of said test generation is analyzed according to a coverage goal, such that said binding and said generating is performed until said coverage goal is reached.

* * * * *